(12) United States Patent
Cumbie et al.

(10) Patent No.: US 11,784,072 B2
(45) Date of Patent: Oct. 10, 2023

(54) MOLDED SUBSTRATES

(71) Applicant: Hewlett-Packard Development Company, L.P., Fort Collins, CO (US)

(72) Inventors: Michael Wayne Cumbie, Albany, OR (US); Paul David Schweitzer, Corvallis, OR (US); Anthony Donald Studer, Albany, OR (US); Gary Gerard Lutnesky, Corvallis, OR (US); John Edward Davis, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 777 days.

(21) Appl. No.: 16/958,073

(22) PCT Filed: Oct. 4, 2019

(86) PCT No.: PCT/US2019/054862
§ 371 (c)(1),
(2) Date: Jun. 25, 2020

(87) PCT Pub. No.: WO2021/066845
PCT Pub. Date: Apr. 8, 2021

(65) Prior Publication Data
US 2023/0110990 A1  Apr. 13, 2023

(51) Int. Cl.
*H01L 21/673*  (2006.01)
*B41J 2/16*  (2006.01)

(52) U.S. Cl.
CPC ...... *H01L 21/67356* (2013.01); *B41J 2/1637* (2013.01)

(58) Field of Classification Search
CPC .................. H01L 21/67356; B41J 2/1637
USPC ......................................................... 206/701
See application file for complete search history.

(56) References Cited

U.S. PATENT DOCUMENTS

| | | | |
|---|---|---|---|
| 5,163,551 A | * | 11/1992 | Bhatia ............... H01L 21/67356 206/725 |
| 6,464,333 B1 | | 10/2002 | Scheffelin et al. |
| 6,548,895 B1 | | 4/2003 | Benavides |
| 7,371,610 B1 | | 5/2008 | Fan et al. |
| 8,308,273 B2 | | 11/2012 | Silverbrook et al. |
| 10,232,619 B2 | | 3/2019 | Chen et al. |
| 2002/0160630 A1 | | 10/2002 | Kashima |
| 2005/0218499 A1 | | 10/2005 | Chang et al. |
| 2013/0193105 A1 | | 8/2013 | Ciminelli |
| 2013/0213853 A1 | * | 8/2013 | Brautigam ........ H01L 21/67356 206/706 |
| 2014/0077349 A1 | | 3/2014 | Higgins, III |

(Continued)

FOREIGN PATENT DOCUMENTS

| CN | 201466021 U | 5/2010 |
|---|---|---|
| CN | 106794698 A | 5/2017 |

(Continued)

*Primary Examiner* — Jacob K Ackun
(74) *Attorney, Agent, or Firm* — Foley & Lardner LLP (57) ABSTRACT

Examples of molded substrates are described herein. In some examples, a molded substrate may support integrated circuitry. In some examples, the molded substrate and the integrated circuitry are included in a circuitry package for a replaceable print component. In some examples, the molded substrate is relatively flat. In some examples, molding remnants may be on the molded substrate.

15 Claims, 5 Drawing Sheets

100

Align a plurality of molds with a plurality of windows of a metal frame — 102

Mold material in the plurality of molds to produce a plurality of molded substrates in the plurality of windows of the metal frame, where each of the molded substrates is to carry integrated circuitry — 104

(56) References Cited

U.S. PATENT DOCUMENTS

| | | | |
|---|---|---|---|
| 2018/0132703 A1* | 5/2018 | Reever | A61B 1/05 |
| 2018/0265353 A1 | 9/2018 | Chen et al. | |
| 2018/0269125 A1 | 9/2018 | Chen et al. | |
| 2019/0118535 A1 | 4/2019 | Choy et al. | |
| 2022/0396057 A1* | 12/2022 | Murata | B32B 27/32 |

FOREIGN PATENT DOCUMENTS

| | | | |
|---|---|---|---|
| CN | 107539943 A | 1/2018 | |
| CN | 108136415 A | 6/2018 | |
| CN | 108140619 A | 6/2018 | |

* cited by examiner

MOLDED SUBSTRATES

BACKGROUND

Electronic technology has advanced to become virtually ubiquitous in society and has been used to improve many activities in society. For example, electronic devices are used to perform a variety of tasks, including work activities, communication, research, and entertainment. Electronic technology is implemented from electronic circuits. Different varieties of electronic circuits may be implemented to provide different varieties of electronic technology.

DETAILED DESCRIPTION

Some examples of electronic technology may be implemented using integrated circuitry. In some examples, integrated circuitry may be supported by and/or attached to a substrate. A substrate is a material to support integrated circuitry. Examples of substrates may include metals (e.g., lead frame), fiberglass (e.g., FR4), epoxies, resins, and/or plastics, etc.

In some examples, a substrate may be implemented to satisfy a criterion or criteria. For instance, a substrate may be implemented to adhere to integrated circuitry in an environment with liquid or moisture, to avoid leaching (e.g., contaminating liquid), and/or to avoid absorbing liquid. For example, a substrate may be implemented to adhere to integrated circuitry in a print liquid supply unit and/or to avoid destabilizing the print liquid by leaching a contaminant. Print liquid is a liquid for printing. Examples of print liquid include inks and agents (e.g., fusion agent for three-dimensional printing). In some examples, a substrate may be implemented to withstand curing temperatures of adhesives and/or to be robust to shipping/operating environments. In some examples, a substrate may be implemented to satisfy flatness constraints and/or to provide a form factor (e.g., approximately 100 millimeters (mm)×300 mm).

Some of the techniques described herein may provide substrates that are molded in a metal frame. A metal frame is a metal structure with a window or windows. A window is a structure in a metal frame that surrounds a space and/or an opening in a metal frame. In some examples, the metal frame may be a sheet of metal with a punched or stamped window or windows. In some examples, a metal frame may be stainless steel or another metal. A substrate may be molded or formed in a window. In some examples, a metal frame may include patterns of windows. For example, a metal frame may include rows and/or columns of windows.

In some examples, the windows may be rectangular, square, circular, ellipsoid, and/or another shape (e.g., irregularly shaped). In some examples, a window may be elongated, where one dimension of the window is greater in size than another dimension of the window.

In some examples, utilizing a metal frame to produce a substrate or substrates may be beneficial. For instance, a metal frame may be utilized for transport and handling independent of the substrate, which may allow different materials to be utilized to form the substrate. For example, stainless steel may be utilized for the metal frame, while the substrate may be plastic. In some examples, a plastic substrate may provide improved adhesion and reliability relative to a stainless steel substrate. For instance, integrated circuitry may eventually fail to adhere to a stainless steel substrate when soaked in print liquid, without costly surface treatments on the stainless steel substrate. Utilizing a metal frame to manufacture substrates may be beneficial in comparison with fully plastic molded panels. For instance, utilizing a metal frame may reduce costs relative to fully plastic molded panels due to increased waste plastic, which may provide fewer options for recycling in comparison with a metal frame. In some examples, utilizing a metal frame may address manufacturing issues, such as shrinking, bowing, and/or warping, which may occur with fully plastic panels. Addressing these issues without a metal frame may increase manufacturing cost and/or complexity.

In some examples, a molded substrate may be manufactured with thermoplastics. Thermoplastics may be injection molded and may be compatible with high volume manufacturing and/or assembly methods. It may be beneficial for the molded substrate to be compatible with the print liquid and/or to be robust to environmental conditions during shipping/handling. In some examples, molded substrates may be constructed from thermoplastics. In some examples, molded substrates may be constructed from plastics such as polypropylene (PP), low-density polyethylene (LDPE), high-density polyethylene (HDPE), polyethylene terephthalate (PET), polycarbonate (PC), polyphenylene sulfide (PPS), and/or blends thereof.

Throughout the drawings, similar reference numbers may designate similar, but not necessarily identical, elements. Similar numbers may indicate similar elements. When an element is referred to without a reference number, this may refer to the element generally, without necessary limitation to any particular Figure. The figures are not necessarily to scale, and the size of some parts may be exaggerated to more clearly illustrate the example shown. Moreover, the drawings provide examples and/or implementations in accordance with the description; however, the description is not limited to the examples and/or implementations provided in the drawings.

Figure 1:
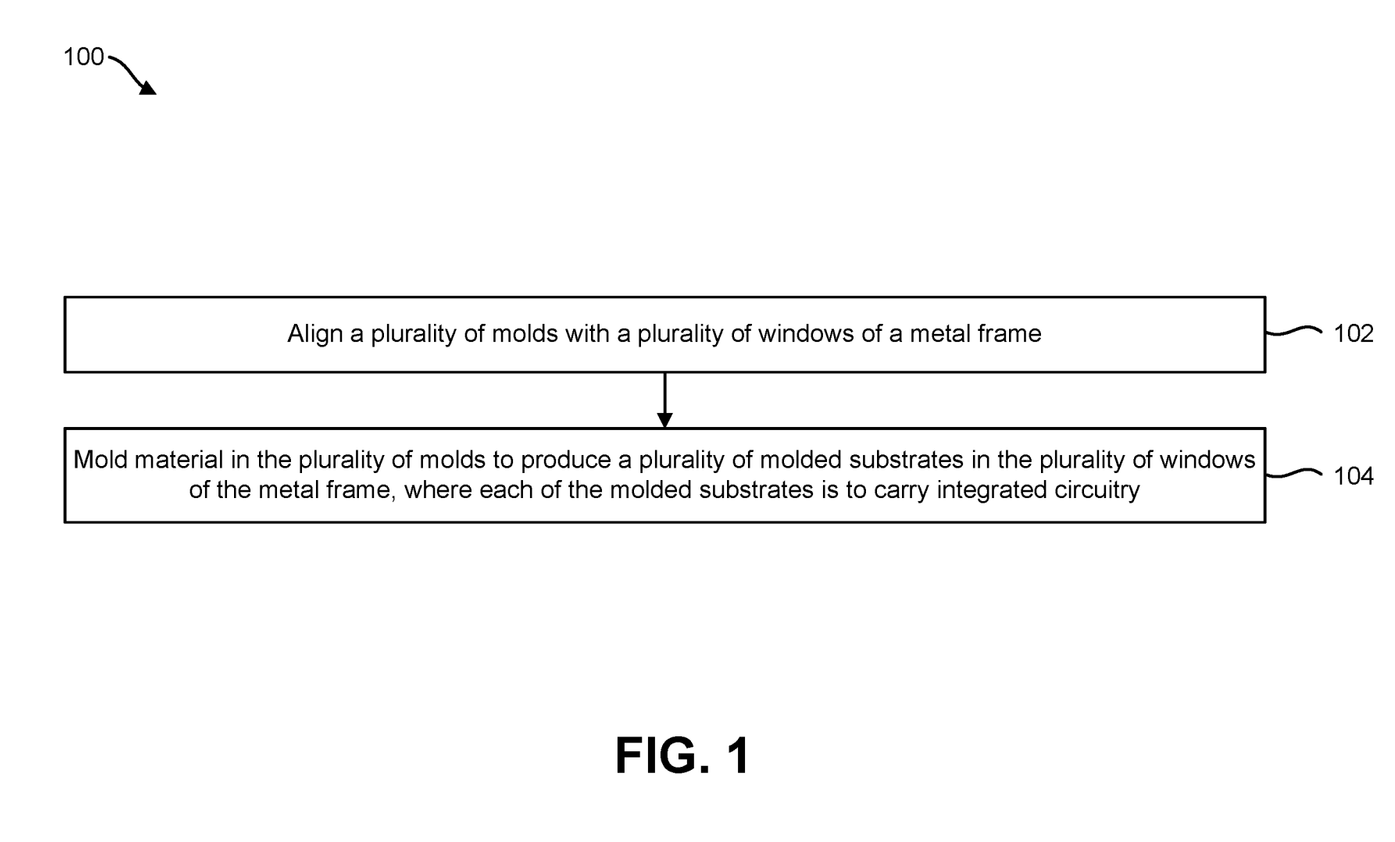
FIG. 1 is a flow diagram illustrating one example of a method for manufacturing molded substrates.

FIG. 1 is a flow diagram illustrating one example of a method 100 for manufacturing molded substrates. In some examples, the method 100 may be performed by a manufacturing machine or machines (e.g., computer(s), server(s), electronic device(s), controller(s), actuator(s), conveyor(s), roller(s), heater(s), and/or injector(s), etc.).

The method 100 may include aligning 102 a plurality of molds with a plurality of windows of a metal frame. A mold is a container for shaping material. For example, a mold may be a container that contains a cavity or space for shaping material. In some examples, a mold or molds may be aligned with a window or windows of a metal frame. For example, a mold or molds may be placed on the metal frame and/or in the window(s) of the metal frame. In some examples, the metal frame and/or the window(s) of the metal frame may be placed on the mold(s). In some examples, a mold may include multiple components. For example, a mold may include two components that may be closed together to form the space or cavity for shaping material. In some examples, aligning the molds with the windows may include mechanically and/or optically aligning the molds with the windows such that a portion of the mold that corresponds to a substrate for manufacture is within a dimension or dimensions (e.g., height and width dimensions) of a window. For instance, the metal frame may include alignment features (e.g., mechanical and/or optical alignment features). The metal frame may be aligned by locating the mechanical alignment feature(s) onto alignment structure(s) (e.g., posts) of the mold(s) and/or by locating the optical alignment feature(s) with marker(s) of the metal frame. In some examples, the alignment feature(s) may be utilized for assembly. For example, the alignment feature(s) may be utilized to align integrated circuitry to be attached to the molded substrate.

In some examples, aligning 102 the plurality of molds may be performed by a machine. For example, a machine may include actuators to align the mold(s) to the window(s) of the metal frame and/or actuators to align the window(s) of the metal frame to the window(s) of the metal frame. In some examples, the machine may utilize a camera and perform computer vision to optically align the mold(s) with the window(s) of the metal frame. In some examples, the mold(s) may be aligned with the window(s) using an alignment feature or feature(s) in the metal frame.

The method 100 may include molding 104 material in the plurality of molds to produce a plurality of molded substrates in the plurality of windows of the metal frame. In some examples, molding 104 the material may include placing (e.g., injecting, forcing, pumping, etc.) the material (e.g., plastic, epoxy, epoxy mold compound, etc.) in the mold. For instance, the material may be in a liquid or molten state when the material is placed in the mold. The mold may have a shape. The material may take the shape of the mold. For example, as the liquid or molten material cools, solidifies, cures, dries, and/or hardens, the material may take the shape of the mold.

In some examples, each of the molded substrates is to carry integrated circuitry. For example, integrated circuitry may be attached to each of the molded substrates. In some examples, the integrated circuitry may be sensor circuitry. For instance, the sensor circuitry may include a liquid level sensor (e.g., print liquid level sensor, digital ink level sensor, etc.), a strain sensor, and/or a pressure sensor.

In some examples, a molded substrate or molded substrates may be relatively flat. In some examples, a molded substrate or molded substrates may be rectangular, square, circular, ellipsoid, and/or another shape (e.g., irregularly shaped). In some examples, a molded substrate may be elongated, where one dimension of the molded substrate is greater in size than another dimension of the molded substrate. In some examples, the molded substrate may be elongated to support elongated sensor circuitry.

In some examples, the plurality of molded substrates may be molded individually, in pairs, or in sets of another number or numbers. For instance, molded substrates that are molded individually may be molded (in sequence or in parallel, for instance) such that the mold for each molded substrate is separated from the mold for each other substrate. In some examples, the plurality of molded substrates may be molded in pairs, such that the material for two molded substrates is molded together (e.g., in a continuous mold or cavity for two molded substrates).

Figure 2:
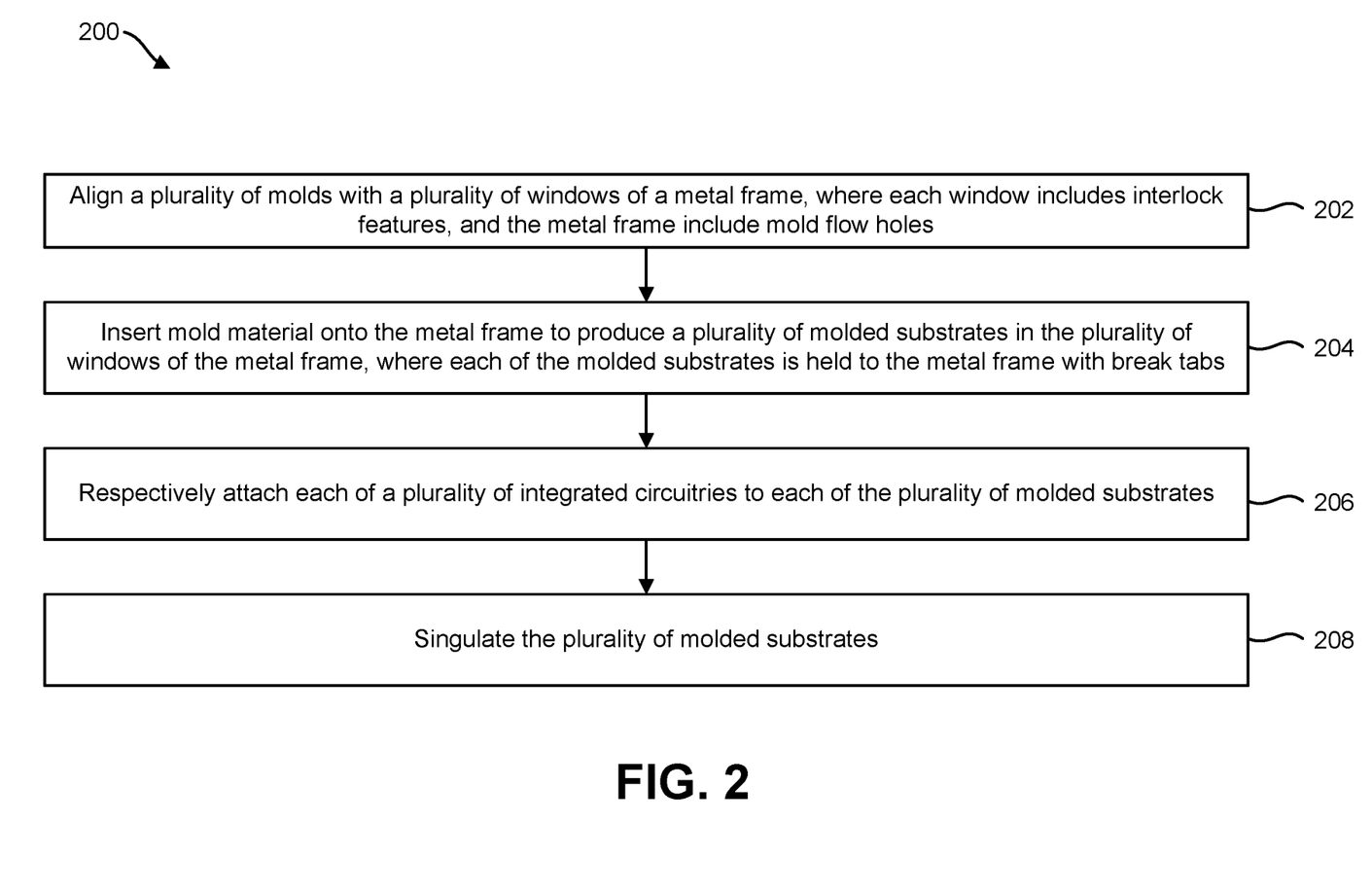
FIG. 2 is a flow diagram illustrating an example of a method for manufacturing molding substrates.

FIG. 2 is a flow diagram illustrating an example of a method 200 for manufacturing molding substrates. In some examples, the method 200 described in connection with FIG. 2 may be an example of the method 100 described in connection with FIG. 1. In some examples, the method 200 may be performed by a manufacturing machine or machines (e.g., computer(s), server(s), electronic device(s), controller(s), actuator(s), conveyor(s), roller(s), heater(s), and/or injector(s), etc.).

The method 200 may include aligning 202 a plurality of molds with a plurality of windows of a metal frame. In some examples, the aligning 202 may be accomplished as described in connection with FIG. 1. In some examples, the plurality of windows may be pre-punched in the metal frame. For instance, the plurality of windows may be punched or stamped in the metal frame before utilizing the metal frame to manufacture molded substrates (e.g., before molding).

In some examples, each window of the metal frame may include an interlock feature or interlock features. An interlock feature is a structure to hold material (e.g., molded material) on the metal frame. Examples of interlock features may include slots, grooves, ridges, holes, indentations, notches, etc. For instance, when molded material is molded on the metal frame, the interlock features may maintain the position of the molded material by interfering with molded material movement in a dimension or dimensions. In some examples, interlock features of a window may include an indentation or indentations on an edge or edges of the window.

In some examples, the metal frame may include a mold flow hole or mold flow holes. A mold flow hole is an opening in the metal frame that allows material to flow or pass through the metal frame from one side of the metal frame to another side of the metal frame. In some examples, the mold flow hole may be located away from a window of the metal frame. For example, a mold flow hole may be distanced from the window of the metal frame.

The method 200 may include insert molding 204 material onto the metal frame to produce a molded substrate or molded substrates in the window(s) of the metal frame. Insert molding is a molding technique where material is molded onto and/or around an insert. In some examples, the insert may be the metal frame. In some examples, the molded substrate(s) may be held to the metal frame with a molded tab or tabs. A molded tab is a structure that protrudes from a molded substrate. In some examples, the molded tab(s) may be a break tab or break tabs. A break tab is a structure to be broken (e.g., severed, separated, cut, parted, etc.). For example, a break tab may be molded onto the metal frame and may support a molded substrate. The break tab may be broken to separate (e.g., singulate) the molded substrate from the break tab and/or the metal frame. In some examples, each of the molded substrates is molded with break tabs, which may hold the molded substrate to the metal frame.

The method 200 may include respectively attaching 206 each of a plurality of integrated circuitries to each of the plurality of molded substrates. For example, integrated circuitry may be attached to each of the molded substrates. In some examples, attaching 206 integrated circuitry to a molded substrate may include applying adhesive to the integrated circuitry and/or to the substrate, and placing the integrated circuitry on the molded substrate. For example, the integrated circuitry may be attached 206 by adhering the integrated circuitry to the molded substrate with an adhesive. In some examples, the integrated circuitry is sensor circuitry. For instance, sensor circuitry may include a liquid level sensor (e.g., print liquid level sensor), a strain sensor, and/or a pressure sensor.

The method 200 may include singulating 208 the plurality of molded substrates. Singulating is a technique to separate a group of joined items into single or individual items. For example, the plurality of molded substrates may be joined to the metal frame. Singulating 208 the plurality of molded substrates may include separating each of the plurality of molded substrates from the metal frame. For instance, each of the plurality of molded substrates may be joined to or attached to the metal frame with a break tab or break tabs. In some examples, singulating 208 the plurality of molded substrates may include breaking (e.g., severing, cutting, shearing, separating, etc.) each molded substrate from a corresponding break tab or break tabs. In some examples, the molded substrates may be singulated 208 using a support and shearing mechanism. For instance, a support may be located under the molded substrates or the molded substrates may be located on the support. The shearing mechanism (e.g., edges, blades, knives, shears, etc.) may shear the molded substrates from the break tabs (e.g., by cutting the break tabs in an opposing direction to the support), which may remove the molded substrates from the metal frame. In some examples, the singulated molded substrates do not include metal from the metal frame. For example, the molded substrates may be spaced within the windows, such that the molded substrate does not include metal from the metal frame and/or does not contact the edges of the windows.

In some examples, an element or elements, function(s), operation(s), etc., of the method 200 may be omitted, combined, and/or performed in a different order than illustrated. For instance, integrated circuitries may be attached 206 to molded substrates after singulation 208 in some examples.

Figure 3:
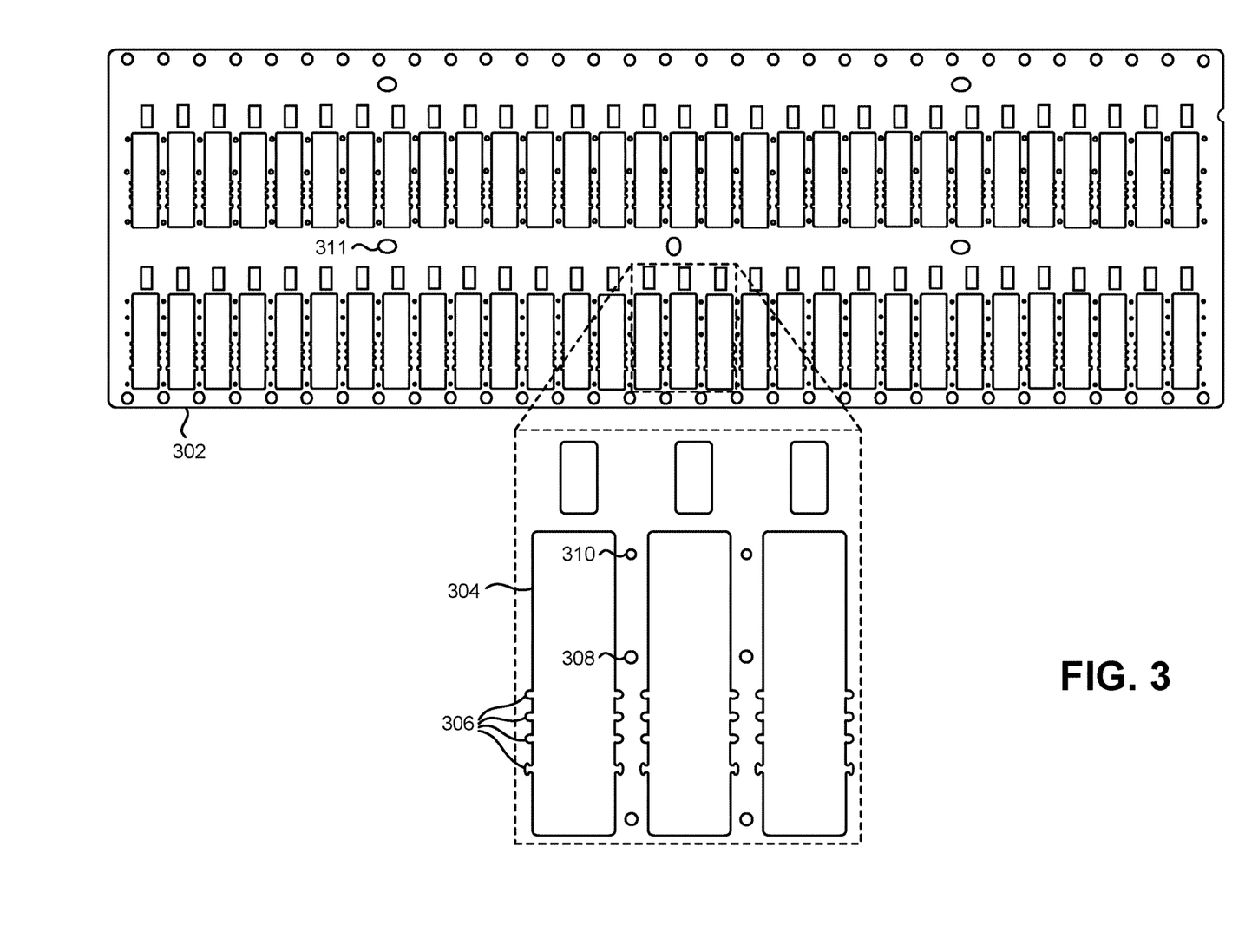
FIG. 3 is a diagram illustrating an example of a metal frame.

FIG. 3 is a diagram illustrating an example of a metal frame 302. The metal frame 302 described in connection with FIG. 3 may be an example of the metal frames described in connection with FIG. 1 and/or FIG. 2. FIG. 3 also illustrates a magnified portion of the metal frame 302. In some examples, the metal frame 302 may be a stainless steel sheet.

In the example illustrated in FIG. 3, the metal frame 302 includes 60 windows. In some examples, a different number of windows may be utilized. One example of a window 304 is illustrated in the magnified portion. Each of the windows includes interlocking features. For example, the window 304 includes interlocking features 306 along the edge of the window 304. In this example, the interlocking features 306 are curved indentations along the edge of the window 304. Other shapes may be utilized in some examples. The interlocking features 306 may interlock with molded material to maintain the position of the molded material on the metal frame 302. In some examples, the interlocking features may allow material (e.g., molten or liquid material) to flow through the interlocking features. When the molded material is set (e.g., cooled, dried, cured, hardened, solidified, etc.), the interlocking features may interfere with the molded material to prevent movement in a direction or directions. In some examples, the interlocking features may be located in a position or positions where a break tab or break tabs are to be molded. For example, the interlocking features may overlap with and/or may be covered by a break tab or break tabs when the break tab(s) are molded. For instance, material of the break tab(s) may flow through the interlocking features in some examples.

In the example of FIG. 3, the metal frame 302 includes mold flow holes. An example of a mold flow hole 308 is illustrated in the magnified portion. The mold flow hole 308 may allow material (e.g., molten or liquid material) to flow from one side of the metal frame 302 (e.g., the front side) to another side of the metal frame 302 (e.g., the back side). In some examples, the mold flow holes may be located in a position or positions where a break tab, break tabs, or break tab coupler(s) are to be molded. For example, the mold flow holes may overlap with and/or may be covered by a break tab, break tabs, or break tab coupler(s) when the break tab(s) are molded. For instance, material of the break tab(s) and/or break tab coupler(s) may flow through the mold flow holes (e.g., front-to-back or back-to-front) in some examples.

In the example of FIG. 3, the metal frame 302 includes alignment features. In some examples, the alignment feature(s) may be utilized for alignment and/or assembly. An example of a first alignment feature 310 is illustrated in the magnified portion. The first alignment feature 310 may be utilized to optically align the metal frame 302 for an assembly procedure. For example, the first alignment feature(s) may be utilized to align integrated circuitry to be attached to the molded substrate. An example of a second alignment feature 311 is illustrated in FIG. 3. For instance, the second alignment feature 311 may be utilized to align the metal frame with a mold or molds by mechanically aligning the second alignment feature 311 with a structure on the mold(s). The metal frame 302 illustrated in FIG. 3 shows five similar second alignment features.

Figure 4A:
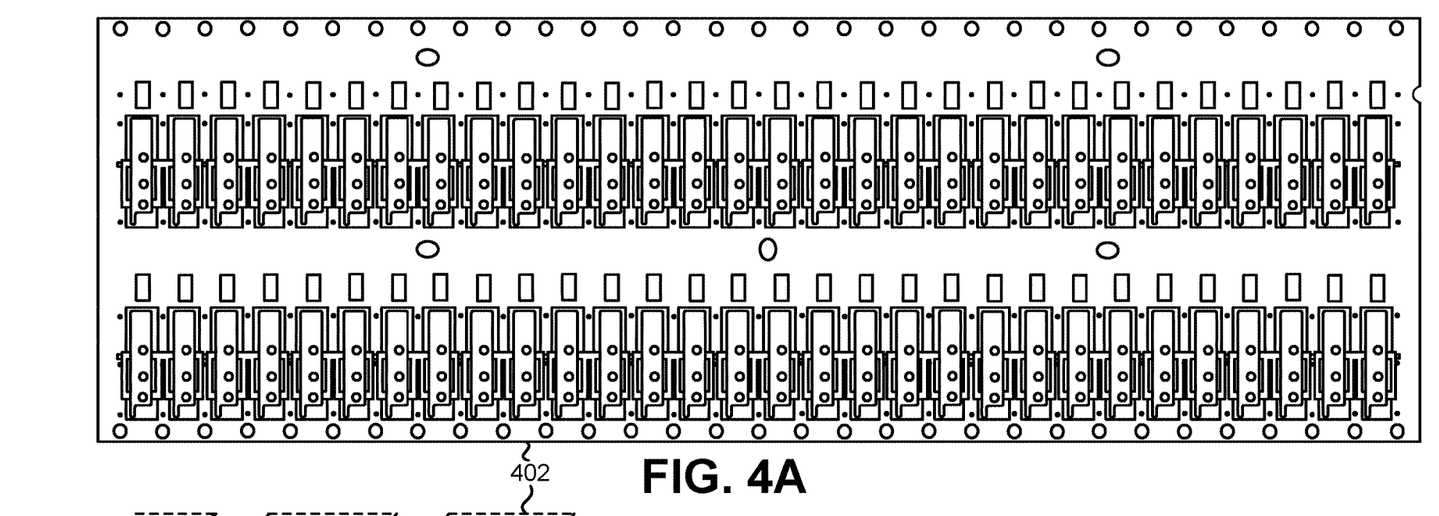
FIG. 4A is a diagram illustrating an example of a metal frame with molded shapes.

FIG. 4A is a diagram illustrating an example of a metal frame 402 with molded shapes. The metal frame 402 may be an example of the metal frame(s) described in connection with FIG. 1, FIG. 2, and/or FIG. 3.

Figure 4B:
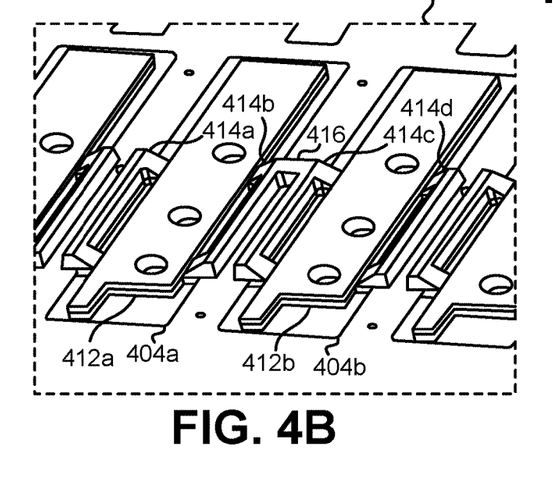
FIG. 4B is a diagram illustrating a perspective view of an example of a portion of the metal frame with molded shapes.
Figure 4C:
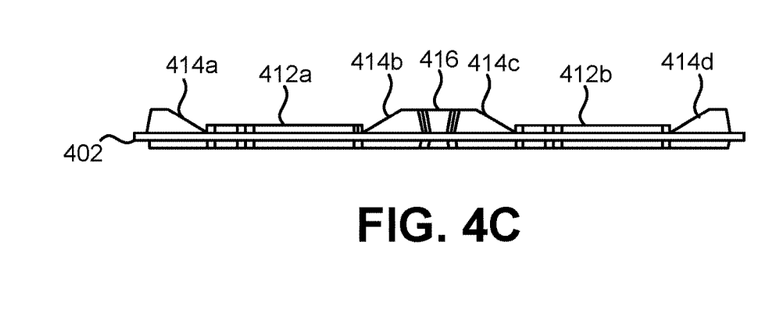
FIG. 4C is a diagram illustrating a side view of an example of a portion of the metal frame with molded shapes.

FIG. 4B is a diagram illustrating a perspective view of an example of a portion of the metal frame 402 with molded shapes. FIG. 4C is a diagram illustrating a side view of an example of a portion of the metal frame 402 with molded shapes. FIG. 4A, FIG. 4B, and FIG. 4C will be described together. FIG. 4A, FIG. 4B, and FIG. 4C illustrate an example of a composite frame. A composite frame is a combination of a metal frame and a plurality of molded substrates. In some examples, a composite frame may include a stainless steel frame including a plurality of windows. A plurality of plastic molded substrates may be included in the plurality of windows of the stainless steel frame. Each of the plastic molded substrates may carry integrated circuitry (e.g., may be manufactured to carry integrated circuitry).

In some examples, a molded shape is molded material that includes a molded substrate or molded substrates and break tabs. In some examples, a molded shape may be positioned in a window of a metal frame during molding. The molded shape may include break tabs attached to the metal frame. For instance, a molded shape may include molded substrate A 412a and break tabs 414a-b as illustrated in FIG. 4B and FIG. 4C. In some examples, a molded shape may include a different number of molded substrates (e.g., 2, 3, 4, etc.) and/or break tabs (e.g., 1, 2, 3, 4, 5, 6, etc.).

In some examples, a molded shape may include break tabs that are molded onto two sides of a metal frame. For example, a molded shape may include break tab A 414a and break tab B 414b, where the break tabs 414a-b are molded onto two sides of the metal frame 402. In some examples, break tabs may be molded along a plurality of interlock features of a window. For example, break tab A 414a and break tab B 414b may be molded along a plurality of interlock features of window A 404a. For instance, the interlock features 306 described in connection with FIG. 3 may be covered by break tab A 414a.

In some examples, molded tabs (e.g., break tabs 414a-b) may be connected to an inner edge (e.g., inner elongated edge) of a window and an outer edge (e.g., outer elongated edge) of a molded substrate. For example, molded tabs (e.g., break tabs 414a-b) may be situated on opposite sides of a molded substrate (e.g., molded substrate 412a) and/or on opposite sides of a window (e.g., window 404a).

In some examples, a break tab coupler may be molded through a mold flow hole in a metal frame. A break tab coupler is material that couples break tabs together. An example of a break tab coupler 416 is illustrated in FIG. 4B and FIG. 4C. For instance, the break tab coupler 416 may be molded through the mold flow hole 308 described in connection with FIG. 4.

In some examples, a molded shape may include a molded substrate attached to break tabs. The break tabs may hold the molded substrate in a window of the metal frame. The molded substrate may be spaced within the window. For instance, a molded shape may include substrate A 412a attached to break tab A 414a and to break tab B 414b. The break tabs 414a-b may hold molded substrate A 412a in window A 404a of the metal frame 402. Molded substrate A 412a may be spaced within window A 404a. For instance, molded substrate A 412a may be distanced from the edges of window A 404a and/or may be suspended in window A 404a. In some examples, molded substrate A 412a may not contact the edges of window A 404a. Break tab A 414a and break tab B 414b may contact the edges of window A 404a.

In some examples, a molded substrate may be cut from break tabs to remove the molded substrate from a metal frame. For example, molded substrate A 412a may be cut from break tab A 414a and break tab B 414b to remote molded substrate A 412a from the metal frame 402. In some examples, a portion of a break tab that is attached to a molded substrate may be thinner than the molded substrate. For example, break tab A 414a and break tab B 414b are thinner than molded substrate A 412a where the break tabs 414a-b attach to molded substrate A 412a, as illustrated in FIG. 4C. In some examples, integrated circuitry may be on a molded substrate of a molded shape. For example, integrated circuitry may be attached to (e.g., adhered to) molded substrate A 412a and integrated circuitry may be attached to (e.g., adhered to) molded substrate B 412b.

In some examples, plastic may be insert molded into a metal frame 402 (e.g., stainless steel frame) window 404a, where the plastic may be secured with interlocking features of the metal frame 402. In some examples, parts (e.g., molded substrate A 412a) may be assembled and later removed from the metal frame 402. In some examples, removing a molded substrate may leave a molding remnant where break tabs were isolated. In some examples, removing a molded substrate may leave no metal on the molded substrate.

In the examples illustrated in FIG. 4A, FIG. 4B, and FIG. 4C, the molded shapes (e.g., molded substrates) are molded in pairs. For example, molds for substrate A 412a, break tab A 414a, break tab B 414b, the break tab coupler 416, substrate B 412b, break tab C 414c, and break tab D 414d may be included in one continuous mold. Substrate A 412a is molded in window A 404a and substrate B 412b is molded in window B 404b. In some examples, molding the molding shapes (e.g., molding substrates) in pairs may provide improved molding attachment and/or stability. The molded shapes including substrate A 412a and substrate B 412b may be separate from other molded shapes (e.g., other break tabs and/or molded substrates). In some examples, separating the molded shapes may reduce bowing and/or warping of the molded substrates. For instance, if molding shapes across a longer length were combined, the molding substrates may suffer from an increased risk of bowing and/or warping across the metal frame.

Figure 5:
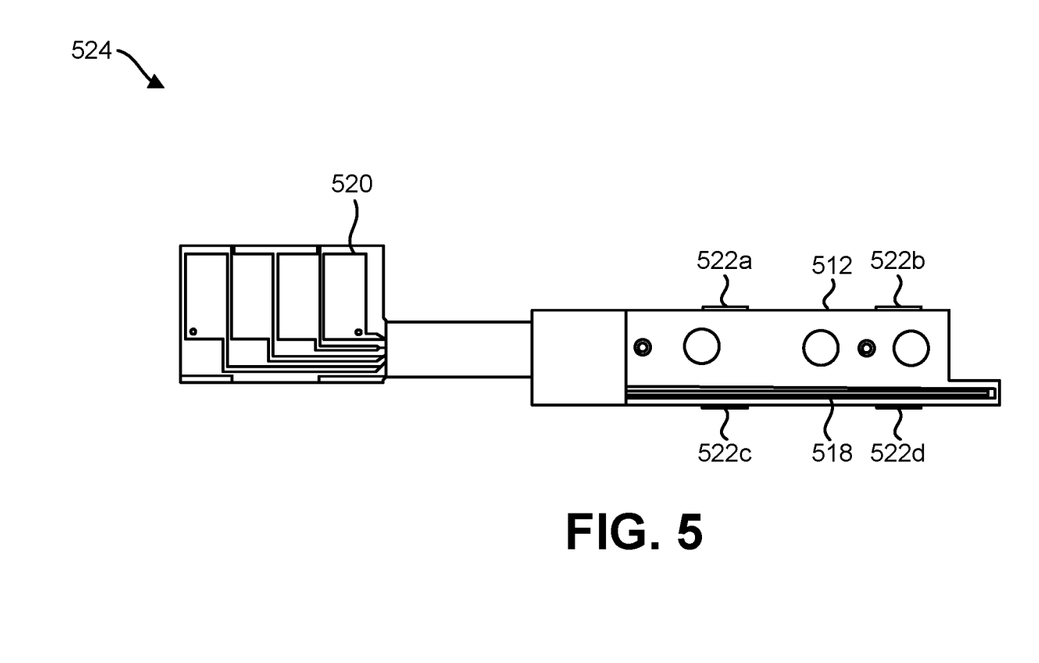
FIG. 5 is a diagram illustrating an example of a circuitry package for a replaceable print component.

FIG. 5 is a diagram illustrating an example of circuitry package 524 for a replaceable print component. A replaceable print component is a component of a printer or printing system that is replaceable. Examples of replaceable print components include print liquid supply units, print cartridges, print heads, etc. Print liquid is a fluid for printing. Examples of print liquid include ink and fusing agent. In some examples, print liquid may be supplied to a printer. For instance, the print liquid may be provided from the print component to a print head assembly. A print head assembly is a device that includes a print head to extrude the print liquid.

A circuitry package for a replaceable print component is a circuitry package for installation in a replaceable print component. Examples of a circuitry package for a replaceable print component may include integrated circuitry on a molded substrate. In some examples, the integrated circuitry may be elongated (e.g., may have a length greater than a width of the integrated circuitry). Examples of the integrated circuitry may include sensor circuitry (e.g., print liquid level sensor(s), digital ink level sensor(s), strain sensor(s), and/or pressure sensor(s), etc.). In some examples, some replaceable print components may include a print liquid level sensor (e.g., digital ink level sensor) to indicate a print liquid level. The print liquid level sensor may be an integrated circuit to be assembled with the molded substrate and installed in the replaceable print component. In some examples, a circuitry package for a replaceable print component may include a flexible circuit die assembly. In some examples, the molded substrate may be flat or relatively flat (e.g., substantially planar, with less than a threshold amount of deflection across the surface, such as less than 10 degrees, 5 degrees, 2 degrees, 1 degree, 0.5 degrees, etc.).

In the example illustrated in FIG. 5, the circuitry package 524 for a replaceable print component may include integrated circuitry 518 on a molded substrate 512 of a molded shape. In some examples, the molded substrate 512 described in connection with FIG. 5 may be an example of the molded substrates described in connection with FIG. 1, FIG. 2, FIG. 3, and/or FIGS. 4A-C. Examples of the integrated circuitry 518 may include print liquid level sensor(s), strain sensor(s), and/or pressure sensor(s). For example, a print liquid level sensor(s) may be utilized to sense a level of print liquid remaining in the replaceable print component. In some examples, when a new print component is installed or when a print head is to be purged for servicing, an air pump in the printer may be used to inflate (e.g., hyper-inflate) the replaceable print component. When the replaceable print component is inflated to a degree, the replaceable print component (e.g., a wall or walls of the replaceable print component) may deflect (e.g., bulge). For example, a wall of a lid and/or a wall of a body of the replaceable print component may deflect. Inflating the replaceable print component may force print liquid into the print head assembly to prime the print head while air is pushed into the print component. In some examples, a strain sensor(s) and/or pressure sensor(s) may be utilized to detect whether an inflation event has occurred.

In some examples, a circuitry package for a replaceable print component may include a contact pad or contact pads and/or may be implemented to interface with a printer. In the example illustrated in FIG. 5, the circuitry package 524 for a replaceable print component includes a set of contact pads 520 that are connected to the integrated circuitry 518.

In some examples, the molded shape of the molded substrate may be positioned in a window of a metal frame during molding. The molded shape may include break tabs attached to the metal frame. In the example illustrated in FIG. 5, molding remnants 522a-d are illustrated. For instance, the molded substrate 512 may be attached to break tabs, which may be attached to a metal frame. The break tabs may be broken (e.g., sheared, cut, separated, etc.) to remove the molded substrate 512 from the metal frame. Breaking the break tabs may leave the molding remnants 522a-d on the molded substrate 512. For example, the molding remnants 522a-d may be break tab remnants or remnants of broken break tabs. The molding remnants 522a-d may be situated on opposite sides of the molded substrate 512 and/or may be situated opposite from each other.

Some examples of the techniques described herein may provide a benefit or benefits. For example, a molded plastic assembly substrate in a metal frame may be lower cost to manufacture in comparison with a fully molded panel. Some examples may provide reduced panel bow for improved handling and carrier free assembly, which may reduce cost complexity. Some examples may provide improved adhesion to integrated circuitry (in comparison with a stainless steel substrate, for example), which may enable more reliable performance for inkjet solutions. Some examples enable utilizing a plastic substrate instead of metal or FR4, which may be problematic for inkjet ink interactions and reliability. In some examples, a metal frame may be recycled, while some plastic frames may not be recyclable. In some examples, a punched metal frame may provide improved tolerances compared to a molded plastic frame and/or may enables better tolerances on individual molded substrates. In some examples, the flexibility and/or hardness of the metal frame can be changed based on target material thickness and/or temper. In some examples, insert molding a substrate in a stainless steel frame with break tabs may ensure that after the substrate is singulated from the stainless steel frame, no residual metals or harmful components are left in the substrate, which can be a risk for print liquid compatibility. In some examples, molding a plastic substrate in a metal frame may allow molded features, such as alignment target(s) and/or drainage features.

The invention claimed is:

1. A circuitry package for a replaceable print component, comprising:
   integrated circuitry;
   a molded substrate supporting the integrated circuitry, wherein the molded substrate is relatively flat; and
   molding remnants on the molded substrate.

2. The circuitry package of claim 1, wherein the molding remnants are remnants of broken break tabs.

3. The circuitry package of claim 1, wherein the molding remnants are situated opposite from each other on opposite sides of the molded substrate.

4. The circuitry package of claim 1, wherein the molded substrate is molded with plastic or epoxy mold compound.

5. The circuitry package of claim 1, wherein the integrated circuitry is sensor circuitry that comprises a print liquid level sensor, a strain sensor, or a pressure sensor.

6. A molded shape, comprising:
   break tabs, wherein the break tabs are molded onto two sides of a metal frame; and
   a molded substrate attached to the break tabs, wherein the break tabs hold the molded substrate in a window of the metal frame.

7. The molded shape of claim 6, wherein the molded substrate is spaced within the window.

8. The molded shape of claim 6, wherein the break tabs are molded along a plurality of interlock features of the window.

9. The molded shape of claim 6, wherein a break tab coupler is molded through a mold flow hole of the metal frame.

10. The molded shape of claim 6, wherein the metal frame comprises a plurality of windows.

11. The molded shape of claim 10, wherein the plurality of windows is pre-punched in the metal frame before molding.

12. A composite frame, comprising:
    a stainless steel frame comprising a plurality of windows; and
    a plurality of plastic molded substrates in the plurality of windows of the stainless steel frame, wherein each of the plastic molded substrates is to carry integrated circuitry.

13. The composite frame of claim 12, further comprising a plurality of alignment features.

14. The composite frame of claim 12, wherein the plurality of plastic molded substrates are molded individually or in pairs.

15. The composite frame of claim 12, wherein the plastic molded substrates do not include metal from the stainless steel frame.

* * * * *